United States Patent
Kouzuma et al.

(10) Patent No.: US 10,141,207 B2
(45) Date of Patent: Nov. 27, 2018

(54) OPERATION METHOD OF PLASMA PROCESSING APPARATUS

(71) Applicant: Hitachi High-Technologies Corporation, Tokyo (JP)

(72) Inventors: Yutaka Kouzuma, Tokyo (JP); Hiroyuki Kobayashi, Tokyo (JP); Nobuya Miyoshi, Tokyo (JP); Kenetsu Yokogawa, Tokyo (JP); Tomoyuki Watanabe, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/468,259

(22) Filed: Mar. 24, 2017

(65) Prior Publication Data

US 2018/0090345 A1    Mar. 29, 2018

(30) Foreign Application Priority Data

Sep. 28, 2016   (JP) ................. 2016-188983

(51) Int. Cl.
*H01L 21/67* (2006.01)
*H01J 37/32* (2006.01)

(52) U.S. Cl.
CPC .. *H01L 21/67069* (2013.01); *H01J 37/32724* (2013.01); *H01J 37/32862* (2013.01); *H01L 21/67115* (2013.01); *H01J 37/3211* (2013.01); *H01J 2237/334* (2013.01)

(58) Field of Classification Search
CPC ......... H01L 21/67069; H01L 21/67115; H01L 37/32724; H01L 21/32862
See application file for complete search history.

(56) References Cited

U.S. PATENT DOCUMENTS

| | | | |
|---|---|---|---|
| 2005/0230350 A1 | 10/2005 | Kao et al. | |
| 2011/0217815 A1* | 9/2011 | Honda | H01L 21/0237 438/158 |
| 2015/0270148 A1 | 9/2015 | Shinoda et al. | |
| 2016/0079073 A1* | 3/2016 | Matsui | H01L 21/02337 438/694 |

FOREIGN PATENT DOCUMENTS

| | | |
|---|---|---|
| JP | 2005-244244 A | 9/2005 |
| JP | 2015-185594 A | 10/2015 |

* cited by examiner

*Primary Examiner* — Duy Vu N Deo
(74) *Attorney, Agent, or Firm* — Mattingly & Malur, PC (57) ABSTRACT

A vacuum processing apparatus includes a processing chamber inside a vacuum vessel, a plasma forming chamber above, a dielectric plate member having multiple through-holes for introducing particles of plasma to the processing chamber between the processing chamber and the plasma forming chamber above a sample stage upper surface in the processing chamber, heating lamp arranged around an outer periphery of the plate member to irradiate an electromagnetic wave to the wafer to heat, and a ring-shaped window member for transmitting the electromagnetic wave from the lamp. The apparatus performs, from the through-holes to the wafer, supplying particles of plasma formed in the plasma forming chamber to form a reaction product, extinguishing the plasma and heating the wafer to desorb the product, and supplying particles, formed in the plasma forming chamber, of the plasma of cleaning gas to the plasma forming chamber, the processing chamber, and the window member.

6 Claims, 4 Drawing Sheets

OPERATION METHOD OF PLASMA PROCESSING APPARATUS

CLAIM OF PRIORITY

The present application claims priority from Japanese patent application JP 2016-188983 filed on Sep. 28, 2016, the content of which is hereby incorporated by reference into this application.

BACKGROUND OF THE INVENTION

1. Field of the Invention

The present invention relates to an operation method of a plasma processing apparatus that performs etching processing for a surface of a film layer to be processed of a structure of a plurality of films including the film layer to be processed that is previously arranged on a surface of a substrate-like sample, such as a semiconductor wafer, arranged in a vacuum vessel, and relates to an operation method of a plasma processing apparatus that performs a process of irradiating particles such as atoms or molecules that are excited to have high reactivity, and a process of heating and etching a sample.

2. Description of the Related Art

To cope with reduction in size and higher performance of electronic devices, semiconductor devices are being downscaled, thinned, and three-dimensioned. A manufacturing process of this three-dimensional semiconductor device necessitates machining of a high-aspect structure and a three-dimensional structure, and requires a technique and an apparatus for "isotropic etching" that is also capable of lateral etching with respect to a wafer surface, in addition to conventional "anisotropic etching" for vertical etching with respect to a wafer surface.

While lateral isotropic etching has conventionally been performed by wet processing using chemical liquid, due to the progress of downscaling, unprecedented problems have been actualized, including yield reduction that is occurred by pattern collapse caused by a surface tension of the chemical liquid. Thus, it is requested that the wet processing using chemical liquid is replaced with dry processing using no chemical liquid. On the other hand, a dry etching technique has been considered as a cleaning/removal technique using no chemical liquid in recent years.

In this technique, an etchant such as gas, a radical generated by using plasma, or a vapor is supplied to a processing chamber, in which a sample such as a semiconductor wafer is arranged, in an inner part of a vessel. After the etchant is adsorbed to a material to be etched on a sample surface and reacted to form a reaction layer, energy is applied to the reaction layer by heating the sample or the reaction layer, and particles constituting the reaction layer are desorbed from the sample surface, to be removed from the processing chamber. These processes of forming the reaction layer (adsorption) and desorbing and removing the reaction layer (desorption) are repeated as one cycle, to perform etching of the film layer of the material to be etched.

This technique is dry etching processing using no chemical liquid, which can prevent an occurrence of a problem of the pattern collapse described above. Moreover, since an amount of the material to be etched that is removed in one cycle is dominantly influenced by a thickness of the reaction layer that is formed in a saturable adsorption process, there is an action and an effect that an etching amount in one cycle can be controlled to be several nm level or less, which is the thickness that the reaction layer is formed, and etching amount can be regulated with a dimensional accuracy of several nm, by increasing and decreasing the number of cycles.

As a related art of such an etching processing, a technique disclosed in JP-2005-244244-A has been conventionally known. JP-2005-244244-A describes an apparatus that introduces highly reactive particles such as radicals obtained by plasmatizing NF3 gas and NH3 gas supplied into a space for plasma forming in a vessel, into a reaction chamber through a plurality of holes of a distribution plate. The particles are adsorbed to a substrate surface that is supported on a support member arranged in the reaction chamber, to form a film layer of a reaction product. Then, the substrate is brought close to a distribution plate along with the support member, to heat the substrate with heat radiated from the distribution plate to desorb and remove the reaction product.

Additionally, JP-2015-185594-A discloses an apparatus that irradiates a sample surface with ultraviolet light radiated from a light source, such as a lamp, to heat and desorb a reaction product, in order to shorten the time for heating sample until desorption of the reaction product that is formed as a layer on the sample surface by supplying highly reactive particles.

SUMMARY OF THE INVENTION

In the related art, a problem has occurred since the following has not been sufficiently considered.

In other words, in the etching processing in the related art, the adsorption process and the desorption process are alternately repeated, to repeat generation of the film layer of the reaction product and removal of the film layer of the reaction product until a desired thickness of the film to be processed is obtained. Therefore, it is important to reduce an amount of the reaction product that has been desorbed from the substrate and adhered again to remain in the processing chamber, or to efficiently remove the reaction product, for maintaining high operation efficiency and high reliability of the processing apparatus for a long time period.

In particular, in order to shorten the heating time in the desorption process, an apparatus using a means for heating with a light of IR lamp (Infrared lamp), VUV lamp (vacuum-ultraviolet lamp), or the like requires arrangement of a translucent member between the light source and the wafer, for preventing the reaction product from reaching the light source. However, there is a problem that the reaction product adhered to a surface of the translucent member reduces transmission efficiency of the light, increases the time required for heating, and impairs throughput. Such a problem has not been considered in the related art.

An object of the present invention is to provide an operation method of a plasma processing apparatus with improved operation efficiency or reliability.

The object is achieved by an operation method of a vacuum processing apparatus, the apparatus including a vacuum vessel, inside of which is configured to be decompressed; a processing chamber that is arranged in an inner part of the vacuum vessel, in which a wafer to be processed is arranged and processed; a plasma forming chamber that is arranged above this processing chamber, in which plasma is formed by using processing gas supplied into the inner part thereof; a sample stage that is arranged at a lower part inside of the processing chamber, and has an upper surface on which the wafer is mounted; a dielectric plate member that is arranged above the upper surface of the sample stage between the processing chamber and the plasma forming chamber in the vacuum vessel, and includes a plurality of through-holes through which particles of the plasma are introduced into the processing chamber; and a ring-shaped window member that is arranged on an outer peripheral side of the plate member around the plate member above the processing chamber, and is constituted of a lamp for irradiating and heating the wafer with an electromagnetic wave, and a member that faces inside of the processing chamber and transmits the electromagnetic wave from the lamp. The operation method includes performing a process of forming a reaction product on a surface of the wafer by supplying, from the through-holes to the wafer mounted on the sample stage, the particles of the plasma that is formed in the plasma forming chamber by using the processing gas, then performing a process of heating the wafer with the electromagnetic wave and desorbing the reaction product, and then performing a process of supplying a cleaning gas into the plasma forming chamber to supply the particles of the plasma formed in the plasma forming chamber into the plasma forming chamber, the processing chamber, and the window member.

The present invention prevents reduction of throughput, and provides an effect of long term stability of an apparatus.

DESCRIPTION OF THE PREFERRED EMBODIMENTS

Examples of the present invention will be described in detail below with reference to the drawings.

Example

An Example of the present invention is described below with reference to FIGS. 1 and 2.

First, an overview of a general configuration of a plasma processing apparatus according to a first example of the present invention is described with reference to FIG. 1. FIG. 1 is a longitudinal cross-sectional view schematically showing an overview of a configuration of the plasma processing apparatus according to the first example of the present invention.

The plasma processing apparatus 100 shown in the figure includes a vacuum vessel 117 that has, in its inner part, a space where plasma is formed and a space where a sample to be processed is processed, a plasma forming part that is arranged outside of this vacuum vessel 117 and supplies an electric field for forming plasma into an inner part of the vacuum vessel 117, and an evacuation part that has a vacuum pump, such as a turbo molecular pump or a rotary pump, that is arranged at and connected to a lower part of the vacuum vessel 117, and communicates with the space in the inner part of the vacuum vessel 117 where a sample is processed, to evacuate its inner part.

The vacuum vessel 117 includes, in an inner part thereof, the processing chamber 101 where a substrate-like wafer 104 as a sample to be processed is arranged inside, and a discharge chamber 102 that is a space arranged above the processing chamber 101 and plasma 102' is formed therein. Above the discharge chamber 102, there is arranged a lid member 119 that constitutes the vacuum vessel 117 and seals between the inner part and an outer part of the discharge chamber 102.

The processing chamber 101 and the discharge chamber 102 are cylindrical-shaped spaces, and are arranged at positions with their vertical central axes coinciding with each other, or positions similar to an extent capable of being regarded as the coinciding case. The processing chamber 101 and the discharge chamber 102 are divided by a round-shaped dispersing plate 110 that is similarly arranged at a position with a central axis coinciding, or a position similar to an extent capable of being regarded as the coinciding case, and are communicated to each other through a plurality of through-holes arranged at a center of the dispersing plate 110.

A lateral outer periphery of the cylindrical-shaped discharge chamber 102 is surrounded by a discharge tube 108 that is made of quartz and has a cylindrical shape to constitute the vacuum vessel 117, and on an outer periphery of an outer sidewall of the discharge tube 108, a high frequency coil 109, which is a coil antenna supplied with high frequency power at a prescribed frequency, is vertically wound and arranged in multiple tiers. Above the discharge tube 108, while a lid member 119 constitutes the vacuum vessel 117, the round-shaped lid member 119 is mounted and arranged at a position with a center coinciding with that of the discharge chamber, or a position similar to an extent capable of being regarded as the coinciding case.

In this state, an outer peripheral portion of the lid member 119 is mounted above an upper end of a cylindrical-shaped side wall of the discharge tube 108, and a seal member such as an O-ring is interposed between a lower surface of the lid member 119 and an upper surface of a side-wall upper end of the discharge tube 108. This hermetically seals between the inner part of the discharge chamber 102 and an outer part of the vacuum vessel 117.

The vacuum vessel 117 is constituted of a cylindrical-shaped lower block surrounding lower and side portions of the processing chamber 101; a ring-shaped lamp unit 118 that is mounted above a pedestal and constitutes a ceiling face of the processing chamber 101, while the pedestal is a plate-like outer peripheral ring member that constitutes the lower block, is mounted above an upper end of a cylindrical-shaped side wall of the lower block, has a round-shaped central opening, and constitutes the ceiling face of the processing chamber 101; the cylindrical-shaped discharge tube 108 mounted above the lamp unit 118; and the lid member 119 that is mounted above the discharge tube 108 and arranged covering above the discharge chamber 102. Additionally, the dispersing plate 110 is arranged inside of an inner peripheral edge of a ring-shaped lamp unit 118, and a central axis of the round-shaped inner periphery of the lamp unit 118 is arranged so as to be at a position coinciding with a central axis of the processing chamber 101 or the discharge chamber 102, or a position similar to an extent capable of being regarded as the coinciding case.

That is, in this example, the lamp unit 118 is arranged interposed between the processing chamber 101 and the discharge chamber 102, and the lamp unit 118 constitutes the ceiling face of the processing chamber 101 and the lower surface of the discharge chamber 102, or side wall surfaces of those. Moreover, between an upper surface of the lamp unit 118 and a side wall lower end of the discharge tube 108, and between the lamp unit 118 and the lower block of the vacuum vessel 117, above which the lamp unit 118 is mounted, same as between the discharge tube 108 and the lid member 119, a seal member such as an O-ring is interposed. These members are arranged so as to hermetically seal between the inside and outside of the vacuum vessel 117 while constituting the vacuum vessel 117.

At a lower part of the processing chamber 101 below the dispersing plate 110, a stage 103 is arranged. The stage 103 is a cylindrical-shaped member having a round-shaped upper surface that is mounted with a wafer 104 thereabove, which is a substrate-like sample to be processed. At a bottom part of the lower block of the vacuum vessel 117, which is below the stage 103 across a space of the processing chamber 101, a round-shaped opening for evacuation is arranged. The opening is arranged with the vacuum pump constituting the evacuation part, and communicates the processing chamber 101 with an evacuation conduit connecting an inlet of the vacuum pump and the lower block. The particles evacuated from inside of the processing chamber 101 pass through the opening.

In this example, central axes of the cylindrical-shaped stage 103 and the round-shaped opening for evacuation are arranged at positions coinciding with the central axis of the cylindrical-shaped processing chamber 101, or positions similar to an extent capable of being regarded as the coinciding case. According to this configuration, the plasma processing apparatus 100 includes a configuration in which central axes of the lid member 119, the discharge tube 108 or the discharge chamber 102, the lamp unit 118 or the dispersing plate 110, the processing chamber 101 or the lower block, and the opening for evacuation are arranged at coaxial positions coinciding with each other, or positions similar to an extent capable of being regarded as the coinciding case.

The lid member 119 includes a plurality of through-holes at a center of a lower surface constituting a ceiling face of the discharge chamber 102, and gas supply ports 111, which are openings of the through-holes, face the discharge chamber 102. Additionally, an upper part of the lid member 119 is connected to a gas supply device 112 that includes a gas source including a storage part, and a gas supplied from the gas supply device through the conduit is supplied into the discharge chamber 102 from the above through the gas supply ports 111.

In the high frequency coil 109 wound on the outer peripheral side of the side wall of the cylindrical-shaped discharge tube 108, the gas supplied into the discharge chamber 102 is excited to form inductively coupled plasma 102' (ICP). The gas is excited by current formed in the inner part of the discharge chamber 102 near the high frequency coil 109, and the current is formed due to an induction magnetic field that is formed inside of a cylindrical-shaped inner peripheral wall surface of the discharge tube 108 by the supplied high frequency power. A plasma type is not necessarily ICP as in the example shown in FIG. 1. For example, it may be capacitively coupled plasma (CCP), surface wave plasma, or the like, as long as high-density plasma efficiently generates a radical.

The high frequency coil 109 is electrically connected with a high-frequency power source 113 for generating the plasma 102', via a matching device 114.

In this example, for a frequency of power generated and supplied by the high-frequency power source 113, a frequency band of several tens of MHz, such as 13.56 MHz or 27.12 MHz, is used.

In this example, among supplied gases, for the processing gas supplied to process the wafer 104, combustible gases such as NH3, H2, CH2F2, and CH3OH, combustion-supporting gases such as O2 and NF3, and a mixed gas of those are used, and also a mixed gas of those diluted with an inert gas, such as He, Ne, Ar, or N2, may be used. Although not shown in the figure, in the plasma processing apparatus 100 of this example, there is arranged a facility that enables a safe operation of the plasma processing apparatus 100 with using combustible gases or combustion-supporting gases when using those gases.

As the lamp unit 118 that radiates the electromagnetic wave from above the wafer 104 to heat the wafer 104, IR (Infrared) lamp unit is used. The lamp unit 118 in this example includes an IR lamp 106, a reflecting plate 107 that is arranged covering above the IR lamp 106 and reflects the IR light radiated around from the IR lamp 106, and a light transmission window 105 that is constituted of a translucent member, such as made of quartz, that forms an inner peripheral side wall and a lower surface of the ring-shaped lamp unit 118.

For the IR lamp 106 in this example, there is used a circle type (round shape) lamp that is multiply arranged around a central axis concentrically or spirally. The IR lamp 106 is connected to a lamp power supply 115 for supplying power, and between the IR lamp 106 and the lamp power supply 115, there is arranged a high-frequency cut filter 116 for preventing noise of the high frequency power for generating plasma from flowing into the lamp power supply 115.

Although not shown, the lamp power supply 115 is configured such that magnitude of power that is supplied to each arc-shaped part positioned at each radius from a center of the multiply arranged IR lamp 106 (three diameters in the figure) can be regulated respectively and independently, so that a distribution of a temperature or a quantity of heating in a radial direction of the wafer 104 is regulated. A space inside of an inner periphery of the lamp unit 118 is a flow path that is flown through with highly reactive particles such as excited radicals in the plasma formed in the discharge chamber 102 arranged above is excited. In the flow path, there is provided the dispersing plate 110 that is arranged with through-holes for blocking ions and electrons that are generated in the plasma, and transmitting and supplying neutral particles and radicals of a gas to the wafer 104.

From the lower surface to a wall surface on the inner peripheral side of the lamp unit 118, there is arranged the light transmission window 105 made of quartz for passing the IR light. The light transmission window 105 is arranged covering a side part of the inner peripheral side from below the IR lamp 106 with respect to the processing chamber 101, and the IR light is continuously radiated from the IR lamp 106 from a downward direction to a central direction.

Moreover, in this example, the dispersing plate 110 is also constituted of a translucent member such as made of quartz, and most of the IR light that is positioned at an outer peripheral side of the dispersing plate 110 and is radiated toward the dispersing plate 110, without being blocked by the dispersing plate 110, passes through the dispersing plate 110 to reach the inner part of the processing chamber 101. Additionally, as a means for heating the wafer 104, a VUV lamp may be used instead of the IR lamp. In this case, as a member constituting the light transmission window 105, synthetic quartz that passes a VUV light having a short wavelength may be used.

Further, the stage 103, in an inside thereof, is arranged with a cylindrical-shaped metal member, and a flow path that is arranged inside of the metal member. In the flow path, a coolant, a temperature of which has been regulated in a chiller (freezer) to set a temperature of the member or the stage 103 to a value within an expected range that is suitable for processing, is circulated and supplied, and flows through. Above the metal member, there is arranged a film made of dielectric, such as ceramic, that has a plurality of film-shaped electrodes arranged inside thereof. The electrodes are supplied with DC power for generating electrostatic force that holds the wafer 104 on the stage 103 during processing.

On an upper surface of the film, there is arranged an opening through which heat transfer gas such as He is supplied into a gap between a backside of the wafer 104 and the upper surface of the film with the wafer 104 electrostatically adsorbed, and the gas supply accelerates heat transfer between the wafer 104 and the stage 103, to efficiently regulate the temperature of the wafer 104 in processing to a value within a desired range that is suitable for processing. Moreover, on a pathway for evacuation between an opening for evacuation below the stage 103 and an inlet of the vacuum pump, there is arranged a pressure control valve for increasing and decreasing a cross sectional area of the flow path of the pathway or the opening to regulate a flow or a speed of evacuation.

Next, a flow of an operation of the plasma processing apparatus according to the example is described with reference to FIG. 2. FIG. 2 is a flowchart showing a flow of an operation of the plasma processing apparatus according to the example shown in FIG. 1.

The operation of the plasma processing apparatus 100 of the example shown in this figure includes processes of transferring the unprocessed wafer 104 to be processed into the processing chamber 101 and arranging on the stage 103; subsequently applying processing to the film layer to be processed having a film structure that is constituted of a plurality of film including a mask layer that is previously arranged on the surface of the wafer 104; transferring out the processed wafer 104 to outside of the processing chamber 101; and removing substances adhered to a surface of a member facing the processing chamber 101 which the wafer 104 has been transferred from and has been sealed to perform cleaning to bring a condition close to that of before a start of processing. The process of applying processing to the surface of the film layer of the wafer 104 includes a step of repeating multiple times so as to obtain a desired result as described below.

Figure 1:
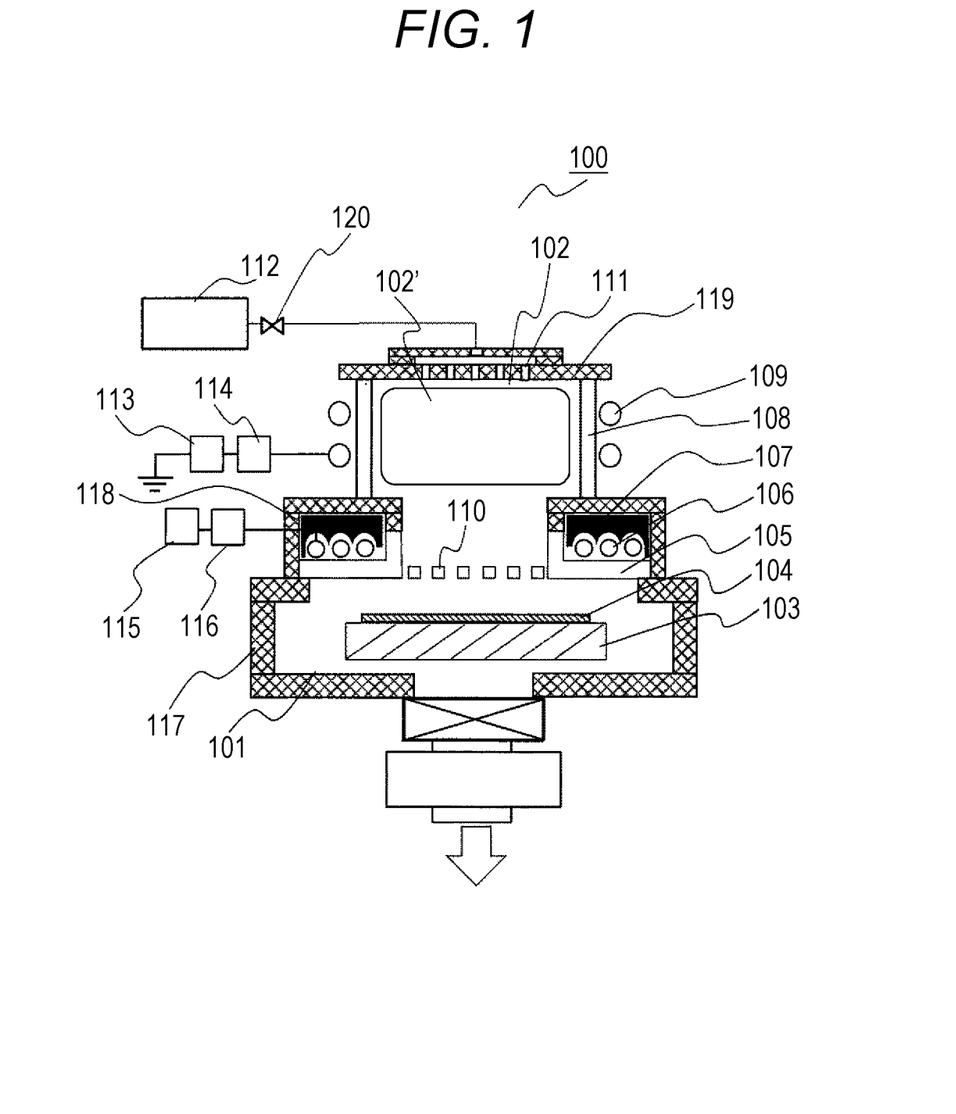
FIG. 1 is a longitudinal cross-sectional view schematically showing an overview of a configuration of a plasma processing apparatus according to a first example of the present invention.
Figure 2:
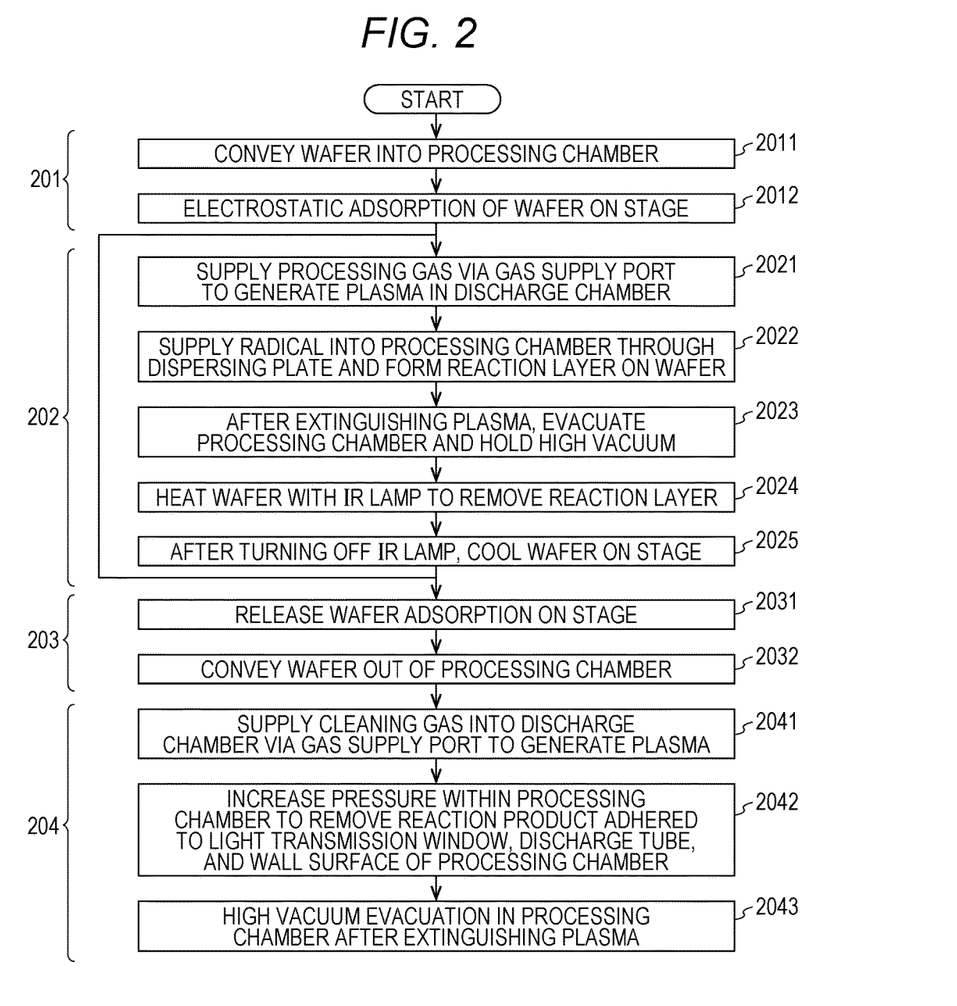
FIG. 2 is a flowchart showing a flow of an operation of the plasma processing apparatus according to the example shown in FIG. 1.

It should be noted that, in this example, the operation performed by the plasma processing apparatus 100 shown in FIG. 2 is based on an instruction signal from a control device that is not shown. The control device transmits the instruction signal to cause such an operation of the plasma processing apparatus 100. The control device is connected such that the instruction signal and a signal from a sensor arranged at a part, such as the vacuum vessel 117, can be communicated between each of parts, components, and power sources that constitute the plasma processing apparatus 100, and are shown in FIG. 1.

The control device includes a calculator that is constituted of a semiconductor device such as a microprocessor; an interface that transmits and receives a signal communicated between the plasma processing apparatus 100 and the control device; and a storage device including memory such as RAM or ROM, or a drive such as an HDD or CD-ROM. The storage device writes and stores data in the signal, or a value of a signal output by the calculator, a software or a program, in which an algorithm for operating the calculator is written, is previously stored and read out from the storage device. These are communicatably connected to form the control device. The control device may be provided at a level of a specific floor in a building such as a clean room where the plasma processing apparatus 100 is provided, or may be arranged communicatably to the plasma processing apparatus and a part of the plasma processing apparatus, at another level or in another building.

First, as a wafer transfer process 201, the unprocessed wafer 104 is mounted and transferred on a wafer-holding hand part at an arm tip of a robot arm in a transfer chamber in a vacuum transfer vessel, and due to an extension of the arm, the hand part enters the inner part of the processing chamber 101 from the transfer chamber to transfer the wafer 104 into the processing chamber 101 and pass the wafer 104 onto the stage 103 (step 2011). On the surface of the wafer 104, there is previously arranged the film structure including a film layer subjected to etching processing. The vacuum transfer vessel, now shown, includes the transfer chamber which is another vacuum vessel connected to an outer wall of the lower block of the vacuum vessel 117, and is a decompressed inner space. The robot arm is a transfer device that includes an arm that is arranged in the transfer chamber, and a whole of which is extended or contracted by rotation of a beam-like member around an axis of a joint that connects both ends of a plurality of beam-like members to constitute the arm. After the arm is retracted to the transfer chamber outside of the processing chamber 101, the wafer 104 is mounted on the dielectric film upper surface of the upper part of the stage 103, and electrostatically adsorbed and held (step 2012).

Next, as a cycle removing process 202 starts, the processing gas supplied from a processing gas supply device 112 is introduced into the discharge chamber 102 from the above, via the gas supply ports 111. Further, the high-frequency power source 113 supplies the high frequency power to the high frequency coil 109, and due to an induction current formed in the discharge chamber 102, atoms or molecules of the processing gas supplied into the discharge chamber 102 are excited to form plasma 102' (step 2021).

Radicals that are included in the plasma 102', or that are particles excited by charged particles included in the plasma 102' to have high reactivity move downward while being dispersed in the discharge chamber 102, pass the through-holes of the dispersing plate 110 to enter the processing chamber 101, reach the upper surface of the wafer 104 that is held on the upper surface of the stage 103 in a lower part the processing chamber 101, cause a physical or a chemical reaction with a material of the film layer that is arranged on the upper surface of the wafer 104 and is to be processed, and generate a reaction product to form a layer (step 2022). Here, since such a reaction is saturable, as a result of the reaction, a thickness of the reaction layer can be regulated with high accuracy by increasing and decreasing a time for irradiation of the supplied radicals to the upper surface of the wafer 104.

After a certain thickness of the reaction layer is formed, the plasma is extinguished by reducing the high frequency power for plasma forming supplied from the high-frequency power source, or power for forming bias potential that is supplied from the high-frequency power source to an electrode arranged in the stage 103, the processing chamber 101 and the discharge chamber 102 are quickly evacuated to a predetermined high vacuum degree by an operation of the vacuum pump that is provided at the lower part of stage 103 in the processing chamber 101 (step 2023). When the vacuum degree is detected by a pressure gauge, not shown, attached to the vacuum vessel 117, and detected by the control device, power is supplied to IR lamp 106, the electromagnetic wave (light in an infrared band) is radiated toward the upper surface of the wafer 104, the wafer 104 is heated, and the product of the reaction layer is applied with energy required for desorption of particles constituting the product from the surface of the wafer 104 (step 2024).

For desorption of the reaction product and removal of the reaction layer thereby, applying energy equal to or more than predetermined value to the particles constituting the material is sufficient. In this example, the wafer 104 receives IR radiated from the IR lamp 106 of the lamp unit 118 to be heated to a temperature equal to or more than the predetermined value, which enables energy to be uniformly applied to the reaction product constituting the surface of the reaction layer to reduce imbalance in an amount of particles desorbed from the surface, and distribution of an amount of the reaction layer to be removed from the surface of the wafer 104 can be more uniform. After the predetermined amount of the reaction layer is removed, the power supplied to the IR lamp 106 is stopped, the IR radiation and heating of the wafer 104 caused by the IR radiation is stopped. While the coolant made to have a lower temperature than the wafer 104 flows through the flow path in the inner part of the stage 103, and the heat transfer gas is supplied between wafer 104 and the stage 103 to accelerate the heat transfer, the wafer 104 is subsequently cooled to a temperature suitable for adsorption of the reactive particles such as radicals to the surface of the film layer to be processed (step 2025).

After that, the control device, not shown, of the plasma processing apparatus 100 determines if remaining film thickness of the film layer to be processed has reached a value equal to or less than an expected value, and when it is determined not to have reached, the cycle removing process is started again by returning to the step 2021 of forming plasma 102'. When the film thickness is detected to have reached the expected value, the processing proceeds to the wafer transfer process 203.

In the wafer transfer process 203, firstly, the electrostatic adsorption of the wafer 104 to the stage 103 is released (step 2031). In this step, for example, DC power is supplied so as to be opposite to polarity formed by the DC power supplied to two film-shaped electrodes in the dielectric adsorption film during processing.

After that, a plurality of pusher pins, not shown, accommodated in the stage 103 move upward above the adsorption film, thereby the wafer 104 is mounted on tips of the pusher pins and raised above the stage 103, mounted and passed on the hand part constituting the arm tip of the robot arm in the transfer chamber, which has entered the processing chamber 101, and transferred out from the processing chamber 101 to the transfer chamber due to a contraction of the arm (step 2032).

In this example, after the wafer transfer process 203, a cleaning process 204 is performed to remove substances including the reaction product adhered to an inner surface of the vacuum vessel 117. In this process, in the inner part of the vacuum vessel 117, the gas supply device 112 introduces NF3, SF6 gas, or mixed gas of those diluted with an inert gas such as O2, N2, Ar, He, or Ne, into the discharge chamber 102 via the gas supply ports 111. Then, the induction current in the discharge chamber 102, which has been formed by a supply of the high frequency power from the high-frequency power source to the high frequency coil 109, excites the mixed gas to form the plasma (step 2041).

In this step, a pressure in the processing chamber 101 is made to be a pressure of a higher value than a pressure value at a time when the cycle removing process is performed, by an operation of the pressure control valve, which has been regulated based on the instruction signal from the control device, arranged between the opening for evacuation and the inlet of the vacuum pump. In this state, there is performed the cleaning of the inner surface of the vacuum vessel 117 including the surface of the lamp unit 118, in step 2042.

In particular, charged particles or highly reactive particles formed with plasma of the mixed gas are supplied to these inner wall surfaces to generate an interaction, and the interaction removes substances including the reaction product that are formed in the inner part of the vacuum vessel 117 and adhered to the discharge tube 108, the light transmission window 105 of the lamp unit 118, the inner wall surface of the lower block constituting the processing chamber 101, of the vacuum vessel 117. Additionally, during the cleaning step, the control device detects an intensity of light emission having specific wavelength that is received from plasma through a light receiver arranged near the opening for evacuation of the processing chamber 101 or at a side wall of the discharge tube 108, and compares with a predetermined value for determination to determine an end point the cleaning.

The step 2042 continues until the end point is detected, and after the end point is detected, the supply of the mixed gas or the supply of the high frequency power to the high frequency coil is stopped to extinguish plasma. Further, in response to the instruction signal from the control device, an operation of the vacuum pump or the pressure control valve causes vacuum evacuation up to a higher vacuum degree than that of the steps 2041 and 2042, or the cycle removing process 202, and decompresses to finish the cleaning processing (step 2043).

After the cleaning process 204 is finished, if there is an unprocessed wafer 104 to be processed next, the processing returns to the wafer transfer process 201 and the wafer 104 is transferred into the processing chamber 101. If there is no wafer 104 to be processed, the processing of the wafer 104 by the plasma processing apparatus 100 is stopped.

Although, no wafer is arranged in the processing chamber 101 in the cleaning process 204 in this example, the stage 103, before starting the step 2041, may be mounted with a dummy wafer for cleaning process, which is made of a material such as Si considered to have a small influence on the cleaning action, to perform the steps 2041 and 2042. This prevents the dielectric film from wearing caused by the electrostatic adsorption of the surface of the stage 103, particularly the wafer 104, with the interaction of the mixed gas and the particles in the plasma in the cleaning process 204.

Performing such a cleaning process 204 enables efficient removal of the reaction product adhered to the wall surface constituting the inner surface of the vacuum vessel 117 including the surface of the transmission window 105, and improves the yield of etching processing of the wafer 104, and the throughput of wafer processing of the plasma processing apparatus 100.

Modification

Figure 3:
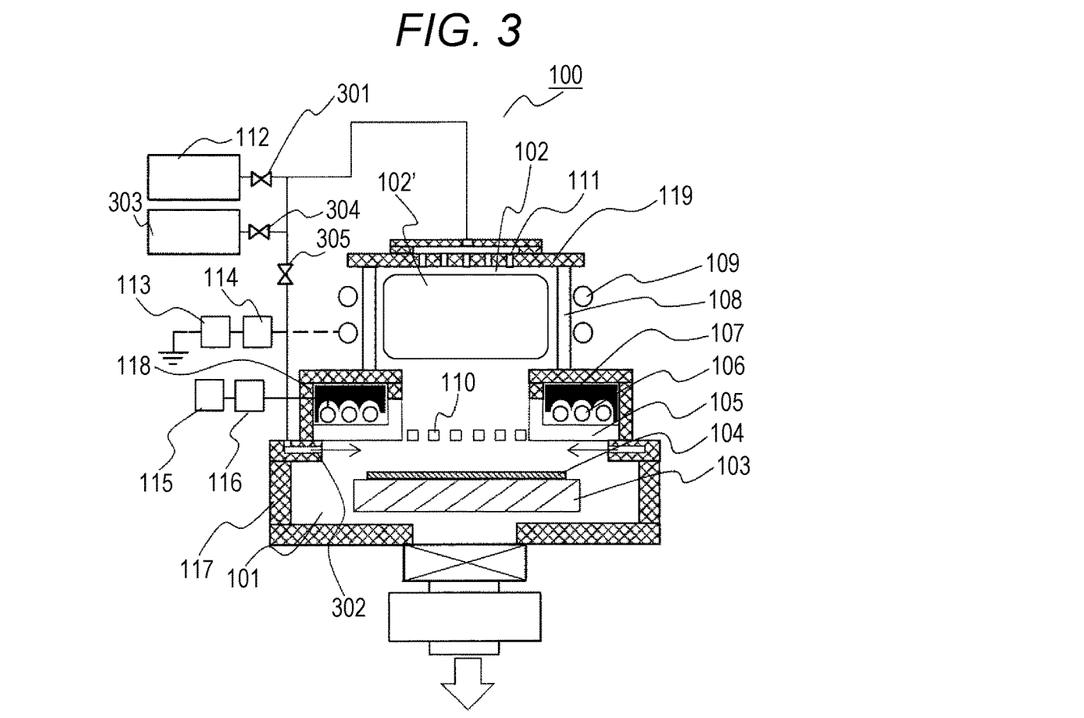
FIG. 3 is a longitudinal cross-sectional view schematically showing an overview of a configuration of a plasma processing apparatus according to a modification of the example shown in FIG. 1.
Figure 4:
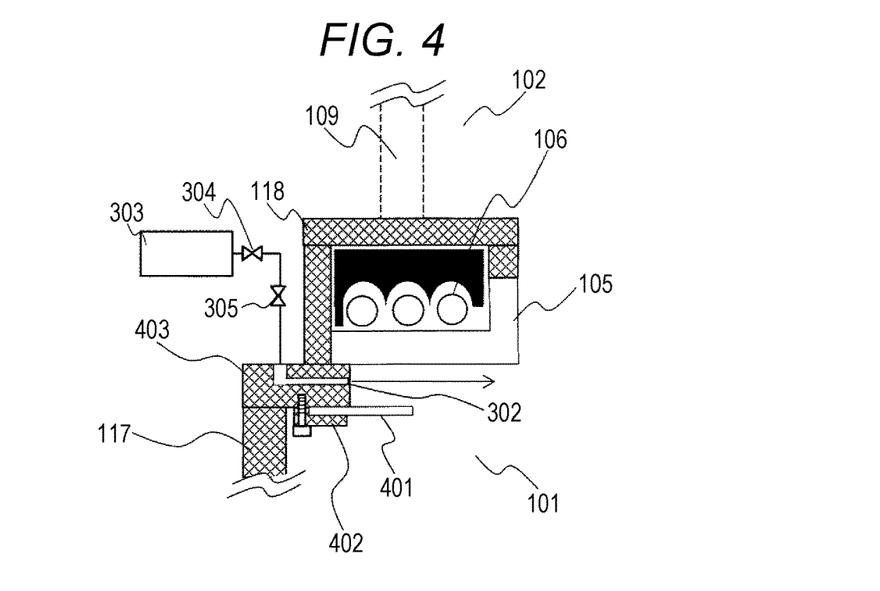
FIG. 4 is a longitudinal cross-sectional view schematically showing, in an enlarged manner, a configuration near one gas supply port of the plasma processing apparatus according to a modification shown in FIG. 3.
Figure 5:
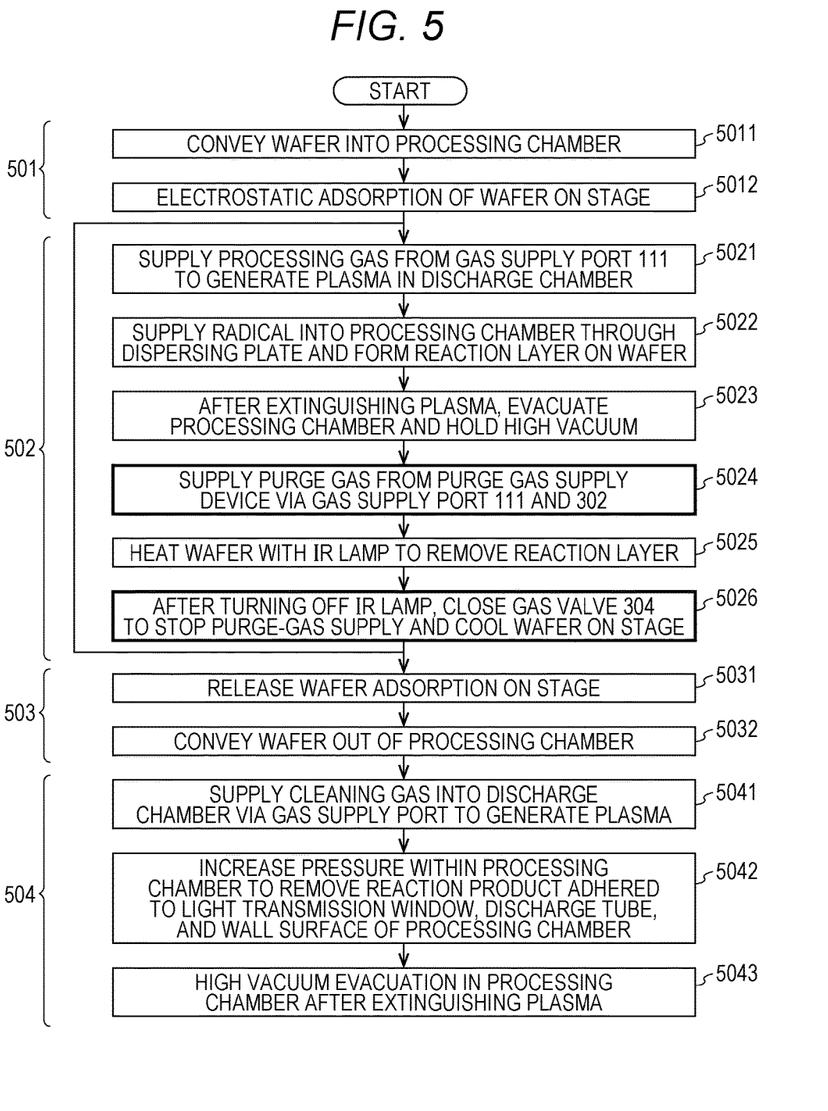
FIG. 5 is a flowchart illustrating a flow of an operation of the plasma processing apparatus according to the modification shown in FIG. 3.

Next, a modification of the example shown in FIG. 1 is described with reference to FIGS. 3 to 5. FIG. 3 is a longitudinal cross-sectional view schematically showing an overview of a configuration of a plasma processing apparatus according to the modification of the example shown in FIG. 1.

The modification shown in the figure includes, in addition to the configuration of the example shown in FIG. 1, a gas supply port 302 that is arranged in the lower block of a vacuum vessel 117 having a lamp unit 118 thereabove and supplies a purge gas into a processing chamber 101, and a purge gas supply device 303 that supplies the purge gas to the gas supply port 302. The purge gas supply device 303 is connected to the gas supply port 302, and also connected to a piping constituting a gas supply passage for processing gas, which connects between a gas supply device 112 and a lid member 119, via a piping constituting a purge gas supply passage.

Between the gas supply device 112 and a connecting part of the piping constituting the gas supply passage for the purge gas on the piping constituting the gas supply passage for processing gas, there is arranged a gas valve 301 for increasing and decreasing a flow or a speed of the processing gas passing in its inner part, or for opening and hermetically closing a conduit. Additionally, on the purge gas supply passage between the purge gas supply device 303 and a connecting part with the piping constituting the gas supply passage for purge gas, which is on the piping constituting the gas supply passage for the gas supply port 302 and the processing gas, there is arranged a gas valve 304 for opening and hermetically closing a conduit of the piping, the inner part of which the purge gas flows, or for increasing and decreasing a flow or a speed of the purge gas.

Also in this example, while the processing gas from the gas supply device 112 is supplied to a discharge chamber 102 from gas supply ports 111 arranged in the lid member 119, in order to prevent the processing gas from passing the purge gas supply passage and being introduced from the gas supply port 302 to the processing chamber 101, there is arranged a gas valve 305 for opening or hermetically closing a flow path in the piping between the gas valve 304 and the gas supply port 302, on the piping constituting the purge gas supply passage and connecting the gas supply port 302 with the piping constituting the gas supply passage for the processing gas. While the processing gas is supplied from the gas supply ports 111 to the discharge chamber 102, the gas valve 305 hermetically closes the piping constituting the purge gas supply passage based on an instruction signal from a control device.

The gas supply port 302 is a plate-like outer peripheral ring member that constitutes the lower block of the vacuum vessel 117, is mounted above an upper end of a cylindrical-shaped side wall of the lower block, has a round-shaped central opening, and constitutes a ceiling face of the processing chamber 101. The opening is arranged on an inner wall constituting a ring inner peripheral edge of a pedestal of the lamp unit 118 mounted thereabove, and an axial direction of the opening is arranged such that the supplied purge gas flows out toward a lower surface of the light transmission window 105 of the lamp unit 118 positioned above and at a center side of the processing chamber 101. In this example, a preferable gas supply port 302 is at a position that is directly under the lower surface of the light transmission window 105 arranged in a ring shape, and is in a peripheral direction therearound, at an angle coinciding with a central axis of the processing chamber 101 or the lamp unit 118, or an angle similar to an extent capable of being regarded as the coinciding case, such that a slit constituting an opening of the gas supply port 302 is arranged at an inner peripheral side wall of the central opening of the outer peripheral ring member serving as the pedestal.

A configuration of the gas supply port 302 shown in FIG. 3 is described in detail with reference to FIG. 4. FIG. 4 is a longitudinal cross-sectional view schematically showing, in an enlarged manner, a configuration near one gas supply port of the plasma processing apparatus according to a modification shown in FIG. 3.

In this figure, the gas supply port 302 is a through-hole arranged in an inner part of the outer peripheral ring member 403 that constitutes the vacuum vessel 117 and is mounted on the upper end of the cylindrical-shaped side wall of the lower block surrounding an outer periphery of processing chamber 101, and a first end of the opening is arranged on an outer wall surface of the lower block of the vacuum vessel 117 to be connected to the piping constituting the purge gas supply passage. A second end of the opening is arranged at an inner peripheral side wall of a ring around the central opening of the outer peripheral ring member 403.

An axial direction of the second end of the opening of the gas supply port 302 is arranged toward a center of the round-shaped central opening of the outer peripheral ring member 403, in a direction parallel to the lower surface of the light transmission window 105 of the lamp unit 118 mounted above the outer peripheral ring member 403, or a direction similar to an extent capable of being regarded as the parallel direction. Under the gas supply port 302, which is below the lower surface of the outer peripheral ring member 403, there is arranged a guide plate 401 that is arranged in a ring shape in a peripheral direction of the inner peripheral edge of the ring of the outer peripheral ring member 403, while covering the inner peripheral edge. The guide plate 401 has a surface parallel to the lower surface of the light transmission window 105 such that the purge gas supplied from the gas supply port 302 and introduced toward the center of the central opening or the processing chamber 101 flows along the lower surface of the light transmission window 105.

A holder 402, which is made of a same material as the outer peripheral ring member 403, is fastened with a member, such as a screw, to the lower surface of the outer peripheral ring member 403 while interposing the guide plate 401, thereby the guide plate 401 is held in the processing chamber 101. The guide plate 401 in this example is made of a material that transmits a same wavelength as the light transmission window 105, such as a material including quartz, in order not to attenuate or block an IR light radiated from the IR lamp.

Next, a flow of an operation of the plasma processing apparatus according to the modification is described with reference to FIG. 5. FIG. 5 is a flowchart illustrating the flow of the operation of the plasma processing apparatus according to the modification shown in FIG. 3.

As with the example shown in FIG. 2, the operation of the plasma processing apparatus 100 of this example includes processes of transferring an unprocessed wafer 104 to be processed into the processing chamber 101 and arranging on the stage 103; subsequently applying processing to the film layer to be processed having a film structure that is constituted of a plurality of film including a mask layer that is previously arranged on the surface of the wafer 104; transferring out the processed wafer 104 to outside of the processing chamber 101; and removing substances adhered to a surface of a member facing the processing chamber 101 which the wafer 104 has been transferred from and is sealed to perform cleaning to bring a condition close to that of before a start of processing. The process of applying processing to the surface of the film layer of the wafer 104 includes a step of repeating multiple times so as to obtain a desired result as described below. The operation performed by the plasma processing apparatus 100 is based on the instruction signal from the control device that is not shown.

First, as a wafer transfer process 501, in a transfer chamber of a vacuum transfer vessel, not shown, that is connected to an outer wall of the lower block of the vacuum vessel 117, unprocessed wafer 104 is mounted and transferred on a wafer-holding hand part at an arm tip of a robot arm in the transfer chamber, and transferred into the processing chamber 101 to be passed on the stage 103 (step 5011). On the surface of the wafer 104, there is previously arranged a film structure including a film layer subjected to etching processing. After the arm is retracted to the transfer chamber outside of the processing chamber 101, the wafer 104 is mounted on an upper surface of the dielectric film of the upper part of the stage 103, and electrostatically adsorbed and held (step 5012).

Next, as a cycle removing process 502 starts, based on the instruction signal from the control device, a gas valve 301 is opened with the gas valve 305 hermetically closed, and an operation of the gas valve 301 regulates a flow or a speed of the processing gas from a processing gas supply device 112 to a value within a predetermined range suitable for forming plasma 102', to introduce the processing gas into the discharge chamber 102 from the above, via gas supply ports 111. Further, the high-frequency power source 113 supplies high frequency power to a high frequency coil 109, and due to an induction current formed in the discharge chamber 102, atoms or molecules of the processing gas supplied into the discharge chamber 102 are excited to form plasma 102' (step 5021).

Radicals that are included in the plasma 102', or that are particles excited by charged particles included in the plasma 102' to have high reactivity move downward while being dispersed in the discharge chamber 102, pass through-holes of a dispersing plate 110 to enter the processing chamber 101, and reach the upper surface of the wafer 104 that is held on the upper surface of the stage 103 in a lower part the processing chamber 101. The radicals cause a physical or a chemical reaction with a material of the film layer that is previously arranged on the upper surface of the wafer 104 and is to be processed, and generate a reaction product to form a layer (step 5022). After a certain thickness of the reaction layer is formed, the plasma is extinguished by reducing the high frequency power for plasma forming supplied from the high-frequency power source, or power for forming bias potential that is supplied from the high-frequency power source to an electrode arranged in the stage 103, the processing chamber 101 and the discharge chamber 102 are quickly evacuated to a predetermined high vacuum degree by an operation of a vacuum pump that is provided at the lower part of stage 103 in the processing chamber 101 (step 5023).

When the predetermined vacuum degree is detected by the control device due to an output from a pressure gauge, not shown, attached to the vacuum vessel 117, in response to the instruction signal from the control device, a gas valve 311 arranged on a piping of the gas supply passage for the processing gas is closed, and the flow path in the piping is hermetically closed. In this state, the gas valves 304 and 305 are opened to supply the purge gas from the gas supply device 303 into the purge gas supply passage (step 5024).

While the purge gas having passed the gas valve 304 flows through the purge gas supply passage including the gas valve 305, and is supplied into the processing chamber 101 from the gas supply port 302, the purge gas also flows into the gas supply passage for the processing gas, is supplied into the discharge chamber 102 from the gas supply ports 111 of the lid member 119 from the above, passes the through-holes of the dispersing plate 110 arranged in the opening at a lower center of the discharge chamber 102, and flows into the processing chamber 101. As the result, the purge gas supplied into the vacuum vessel 117 flows toward an upper center of the processing chamber 101 along the bottom surface of the light transmission window 105 and a wall surface on the inner peripheral side, to prevent particles in the processing chamber 101 from reaching the surface of an area where light is transmitted, of light transmission window 105.

Next, with the purge gas being supplied, which has been started in the step 5024, the wafer 104 is heated by receiving infrared radiation caused by a power supply to the IR lamp 106 from a lamp power supply 115, not shown, the reaction product constituting the reaction layer of the surface of the wafer 104 is applied with energy required for desorption of particles constituting the reaction product (step 5025). Also in this example, the wafer 104 receives IR radiated from the IR lamp 106 of the lamp unit 118 to be heated to a temperature equal to or more than the predetermined value, and distribution of an amount of the reaction layer to be removed from the surface of the wafer 104 can be more uniform.

After the predetermined amount of the reaction layer is removed, the power supplied to the IR lamp 106 is stopped, the IR radiation and heating of the wafer 104 caused by the IR radiation is stopped. While the coolant made to have a lower temperature than the wafer 104 flows through the flow path in the inner part of the stage 103, and the heat transfer gas is supplied between wafer 104 and the stage 103 to accelerate the heat transfer, the wafer 104 is subsequently cooled to a temperature suitable for adsorption of the reactive particles such as radicals to the surface of the film layer to be processed (step 5026). At this time, in response to the instruction signal from the control device, the gas valves 304 and 305 hermetically close the purge gas supply passage to stop the supply of the purge gas to the inner part of the vacuum vessel 117.

After that, the control device, not shown, of the plasma processing apparatus 100 determines if remaining film thickness of the film layer to be processed has reached a value equal to or less than an expected value, and when it is determined not to have reached, the cycle removing process is started again by returning to the step 5021 of forming plasma 102'. When the film thickness is detected to have reached the expected value, the processing proceeds to the wafer transfer process 503, and then a wafer transfer process 503 and a cleaning process 504 that include a plurality of step as with those shown in FIG. 2.

After that, if there is an unprocessed wafer 104 to be processed next, the processing returns to the wafer transfer process 501 and the wafer 104 is transferred into the processing chamber 101. If there is no wafer 104 to be processed, the processing of the wafer 104 by the plasma processing apparatus 100 is stopped.

It should be noted that, in this modification, the supply of the purge gas is stopped after heating of the wafer 104 by the IR lamp 106 is finished in the step 5026. In this configuration, there is a risk that, while the wafer 104 is being cooled after the heating is finished, a remaining reaction product that has been desorbed from the wafer 104 in the processing chamber 101 and stays around the wafer 104 may be adhered again to the surface of the wafer 104.

To prevent an occurrence of such a problem, the configuration may be such that the supply of the purge gas is continued in step 5026 until a time of restarting the cycle removing process after the step 5026 is finished and the process returns to the step 5021, and the supply of the purge gas is stopped at restarting the step 5021. Additionally, accretion on the surface of the light transmission window 105 may be removed by supplying cleaning gas from the gas supply port 302 in the steps 5041 and 5042 in the cleaning process 504, and making the cleaning gas, near the light transmission window 105 of the lamp unit 118 in the processing chamber 101, to act with high reactive particles of plasma 102' that has flown in through the dispersing plate 110 from the discharge chamber 102.

In this example, there is achieved a function of removing accretion such as a reaction product adhered to the surface of the light transmission window 105, and it is possible to prevent adhesion of substances constituting the reaction product desorbed from the reaction layer of the surface of the wafer 104, to the light transmission window 105, when heating the wafer 104. This prevents yield reduction of processing caused by that a temperature of the heating was not within an expected range, throughput reduction caused by an increased time of the heating, or an increase in attenuation of IR transmitted through the light transmission window 105 along with an increase in a number of the wafer 104 that are processed by the plasma processing apparatus 100, which causes reduction in efficiency of heating wafer 104 with lamp unit 118, and unevenness of heating of wafer 104 in an in-plane direction of the upper surface of the wafer 104. This allows the processing of the wafer 104 by the plasma processing apparatus 100 to be stable over a long time, and improves reliability and reproducibility of the apparatus and the processing of the apparatus.

It should be noted that, in the steps 2021 and 2022 in the example, and in the steps 5021 and 5022 of the modification, the electrode arranged in the stage 103 or an inner part thereof is not supplied with electric power, such as high frequency power with a predetermined frequency, for forming bias potential above the upper surface of the wafer 104 mounted on the stage 103. However, in order to efficiently form the film layer of the reaction product with radicals supplied to the upper surface of the wafer 104, the electric power may be supplied to form the bias potential above the upper surface of the wafer 104 in these steps.

What is claimed is:

1. An operation method of a vacuum processing apparatus, the apparatus comprising:
   a vacuum vessel having an inside configured to be decompressed;
   a processing chamber that is arranged in an inner part of the vacuum vessel, wherein a wafer to be processed is arranged and processed inside thereof;
   a plasma generating chamber that is arranged above the processing chamber, wherein plasma is generated by using processing gas supplied into an inner part thereof;
   a sample stage that is arranged at a lower part inside of the processing chamber, the sample stage having a top surface for mounting the wafer;
   a dielectric plate member that is arranged above the top surface of the sample stage between the processing chamber and the plasma generating chamber in the vacuum vessel, the dielectric plate member having a plurality of through-holes wherein particles of the plasma are introduced into the processing chamber therethrough; and
   a ring-shaped window member that is arranged on an outer peripheral side of the plate member around the plate member above the processing chamber, the ring-shaped window member constituted of a lamp for irradiating and heating the wafer with an electromagnetic wave, and a member facing inside of the processing chamber and being configured to transmit the electromagnetic wave from the lamp, wherein
   a side surface surrounding a lower surface of the window member and the plate member is constituted of a member that transmits the electromagnetic wave, of the window member, the method comprising:
   performing a process of generating a reaction product on a surface of the wafer by supplying, from the through-holes to the wafer mounted on the sample stage, the particles of the plasma that has been generated in the plasma generating chamber by using the processing gas;
   then performing a process of extinguishing the plasma in the plasma generating chamber and heating the wafer with the electromagnetic wave to desorb the reaction product; and
   then performing a process of supplying a cleaning gas into the plasma generating chamber to supply particles of plasma of the cleaning gas generated in the plasma generating chamber into the processing chamber and to an inner wall surface of the window member facing an interior space of the processing chamber.

2. The operation method of a vacuum processing apparatus according to claim 1, wherein:
   in the process of heating the wafer, the plate member is heated by the electromagnetic wave.

3. The operation method of a vacuum processing apparatus according to claim 1, wherein:
   the process of generating the reaction product on the surface of the wafer and a process of desorbing the reaction product are alternately repeated for a plurality of times.

4. An operation method of a vacuum processing apparatus, the apparatus comprising:
   a vacuum vessel having an inside configured to be decompressed;
   a processing chamber that is arranged in an inner part of the vacuum vessel, wherein a wafer to be processed is arranged and processed inside thereof;
   a plasma generating chamber that is arranged above the processing chamber, wherein plasma is generated by using processing gas supplied into an inner part thereof;
   a sample stage that is arranged at a lower part inside of the processing chamber, the sample stage having a top surface for mounting the wafer;
   a dielectric plate member that is arranged above the top surface of the sample stage between the processing chamber and the plasma generating chamber in the vacuum vessel, the dielectric plate member having a plurality of through-holes wherein particles of the plasma are introduced into the processing chamber therethrough; and
   a ring-shaped window member that is arranged on an outer peripheral side of the plate member around the plate member above the processing chamber, the ring-shaped window member constituted of a lamp for irradiating and heating the wafer with an electromagnetic wave, and a member facing inside of the processing chamber and being configured to transmit the electromagnetic wave from the lamp, wherein a side surface surrounding a lower surface of the window member and the plate member is constituted of a member that transmits the electromagnetic wave, of the window member, the method comprising:

performing a process of generating a reaction product on a surface of the wafer by supplying, from the through-holes to the wafer mounted on the sample stage, particles of the plasma that has been generated in the plasma generating chamber by using the processing gas; and then performing a process of heating the wafer with the electromagnetic wave to desorb the reaction product, while supplying inert gas along an inner wall surface of the window member facing an interior space of the processing chamber while the plasma in the plasma generating chamber has been extinguished.

5. The operation method of a vacuum processing apparatus according to claim 4, wherein:

during a process of heating the wafer to desorb the reaction product, the inert gas is supplied from an outer peripheral side of the ring-shaped window member toward a center side of the processing chamber.

6. The operation method of a vacuum processing apparatus according to claim 4, wherein:

the process of generating the reaction product on the surface of the wafer and a process of heating the wafer to desorb the reaction product are alternately repeated for a plurality of times.

\* \* \* \* \*